US011988963B2

(12) United States Patent
Nawrocki et al.

(10) Patent No.: US 11,988,963 B2
(45) Date of Patent: May 21, 2024

(54) LOW TEMPERATURE CURE PHOTOIMAGEABLE DIELECTRIC COMPOSITIONS AND METHODS OF THEIR USE

(71) Applicants: Daniel J Nawrocki, Chicopee, MA (US); Yasumasa Akatsuka, Westborough, MA (US); Katie Han, Westborough, MA (US)

(72) Inventors: Daniel J Nawrocki, Chicopee, MA (US); Yasumasa Akatsuka, Westborough, MA (US); Katie Han, Westborough, MA (US)

( * ) Notice: Subject to any disclaimer, the term of this patent is extended or adjusted under 35 U.S.C. 154(b) by 157 days.

(21) Appl. No.: 17/092,867

(22) Filed: Nov. 9, 2020

(65) Prior Publication Data

US 2022/0146936 A1 May 12, 2022

(51) Int. Cl.
*G03F 7/004* (2006.01)
*C08G 81/02* (2006.01)
(Continued)

(52) U.S. Cl.
CPC ........... *G03F 7/0388* (2013.01); *C08G 81/02* (2013.01); *C08G 81/025* (2013.01); *G03F 7/004* (2013.01);
(Continued)

(58) Field of Classification Search
CPC .. C08G 81/025; C08G 81/027; C08G 81/023; C08G 65/44; C08G 65/485; C08G 18/69; C08G 18/4879; C08G 18/831; C08G 63/676; C08G 63/918; G03F 7/0388; G03F 7/0045; G03F 7/0751; G03F 7/162;
(Continued)

(56) References Cited

U.S. PATENT DOCUMENTS

2009/0081466 A1 * 3/2009 Ishikawa ............... C08G 59/54
428/416

FOREIGN PATENT DOCUMENTS

JP  2006089723 A1 *  4/2006
JP  2019182989 A1 * 10/2019  ............ C08F 299/00

OTHER PUBLICATIONS

Translation of Claims of Ichiro et al (Year: 2006).*
(Continued)

*Primary Examiner* — Mark F. Huff
*Assistant Examiner* — Andrew Preston Traywick
(74) *Attorney, Agent, or Firm* — James G. Shelnut; THE PATENT PRACTICE OF SZMANDA & SHELNUT LLC

(57) ABSTRACT

Disclosed and claimed herein are photoimageable dielectric compositions for dielectric passivation layers, dielectric protection layers as well as dielectric redistribution layers for use in the manufacture of semiconductors, semiconductor packages and circuit board constructions. More specifically it relates to photoimageable polymers containing vinyl groups capable of being crosslinked during processing and post cured at lower temperatures and shorter times than conventional dielectric materials. The processed compositions are characterized by low dielectric constants and low dissipation factors as well as low moisture uptake, chemical and thermal stability, flexibility and excellent HAST (Highly Accelerated Stress Test) and TCT (Thermal Cycling Test) results. The invention also relates to low dk/df dielectric compositions that are not photoimageable.

20 Claims, 8 Drawing Sheets

(51) Int. Cl.
*G03F 7/038* (2006.01)
*G03F 7/075* (2006.01)
*G03F 7/16* (2006.01)
*G03F 7/32* (2006.01)
*G03F 7/40* (2006.01)

(52) U.S. Cl.
CPC .......... *G03F 7/0045* (2013.01); *G03F 7/0751* (2013.01); *G03F 7/162* (2013.01); *G03F 7/168* (2013.01); *G03F 7/32* (2013.01); *G03F 7/325* (2013.01); *G03F 7/40* (2013.01)

(58) Field of Classification Search
CPC . G03F 7/168; G03F 7/325; G03F 7/40; G03F 7/029; G03F 7/0295; G03F 7/031; G03F 7/0755; G03F 7/027; C08F 236/06; C08L 71/126; C08L 2312/04; C08L 2312/02
See application file for complete search history.

(56) References Cited

OTHER PUBLICATIONS

Translation of Description of Ichiro et al (Year: 2006).*
Translation of Claims of Yasumasa (Year: 2019).*
Translation of Description of Yasumasa (Year: 2019).*

* cited by examiner

LOW TEMPERATURE CURE PHOTOIMAGEABLE DIELECTRIC COMPOSITIONS AND METHODS OF THEIR USE

FIELD OF INVENTION

The invention relates to photoimageable dielectric compositions for dielectric passivation layers, dielectric protection layers as well as dielectric redistribution layers for use in the manufacture of semiconductors, semiconductor packages and circuit board constructions. More specifically it relates to photoimageable polymers containing vinyl groups capable of being crosslinked during processing and post cured at lower temperatures and shorter times than conventional dielectric materials. The processed compositions are characterized by low dielectric constants and low dissipation factors as well as low moisture uptake, chemical and thermal stability, flexibility and excellent HAST (Highly Accelerated Stress Test) and TCT (Thermal Cycling Test) results. The invention also relates to low dk/df dielectric compositions that are not photoimageable.

BACKGROUND OF THE INVENTION

An integrated circuit (IC) is a set of electronic circuits that are manufactured onto a semiconductor, notably silicon. ICs can be made very compact, having upwards of 1.0 million transistors or other electronic components per $mm^2$ and growing. As such the width and size of the conducting lines and interconnections used to connect the transistors and other components to the rest of the microcircuit need to be made smaller and smaller as the technology advances, currently tens of nanometers.

In some cases, when an IC, or microchip, is manufactured, electrical connections called leads are attached from the microchip to a package in which the chip resides using wire bonds. The package is then bonded to a circuit board using a number of techniques such as, J-wing, gull-wing and solder bump interconnects. Many layers of materials, both conductive and non-conductive, are required to interconnect the transistors of microchips to packages to circuit boards and the outside world. In these constructions, photodielectric compositions are required in order to provide dielectric passivation layers, dielectric protective layers and dielectric redistribution layers.

Dielectric redistribution layers are layers of wiring on the chip and/or package that enables electronic interconnection of the microchip to other microchips, to the package and/or to the circuit board, and can be many layers of varying thicknesses, and resolutions. Dielectric redistribution layers are also used in chip stacking technologies.

For example, redistributing IC bond pads before flip chip bumping has become a common process for interconnection. Bumping is a process using solder which is applied as a solder paste and reflowed to create a round ball, or bump, of solder. Dielectric redistribution layers allow solder paste bumping of die originally designed for wire bonding. Wire bonding of the IC provides connections only to the one dimensional periphery of the IC, while dielectric redistribution layers and bumping allows the connections to be distributed throughout the two dimensional surface of the IC. While stud bumps and plated bumps could tolerate the small size and close spacing (for example 100 micron square pads on 150 micron pitch) of wire bond pads, solder paste generally requires more than twice that spacing. Converting peripheral wire bond pads to an area array of solder-bump pads by redistribution overcomes that barrier.

In some applications, dielectric redistribution offers an attractive method to create distributed power and ground contacts. Dielectric redistributed pads also transform off-chip connections from chip scale to board scale, as an alternative to expensive multilayer substrates. Wafer-level chip-scale packages often redistribute to ball-grid array pads as their final external package connection.

More compelling needs have been driving dielectric redistribution. Advances in chip scale packaging, wafer-level packaging, and most recently, 3-D packaging and system-in-package, often require redistributed bond pads.

A dielectric redistribution layer consists of wiring for electronic interconnect, processed by electroplating, vapor deposition, electroless plating or combinations thereof. Dielectric redistribution layers also require materials with low dielectric properties to isolate and insulate the interconnect wiring. As chip and consequently packaging and dielectric redistribution layers are pushed to be smaller and smaller, the material properties need to be able to continue to insulate and isolate the interconnects. Also as the dimensions decrease, processing methods needs to address ease of manufacture, cost issues, repeatability, and control.

Issues relating to dielectric redistribution layers include dielectric constants, dielectric breakdown, thermal, mechanical, electric properties and the like.

Thus there is a need for improved materials and improved processes that are designed to meet the new and ever demanding integrated circuit technology, particularly in the area of dielectric redistribution material properties.

SUMMARY OF EXEMPLARY EMBODIMENTS

Figure 1:
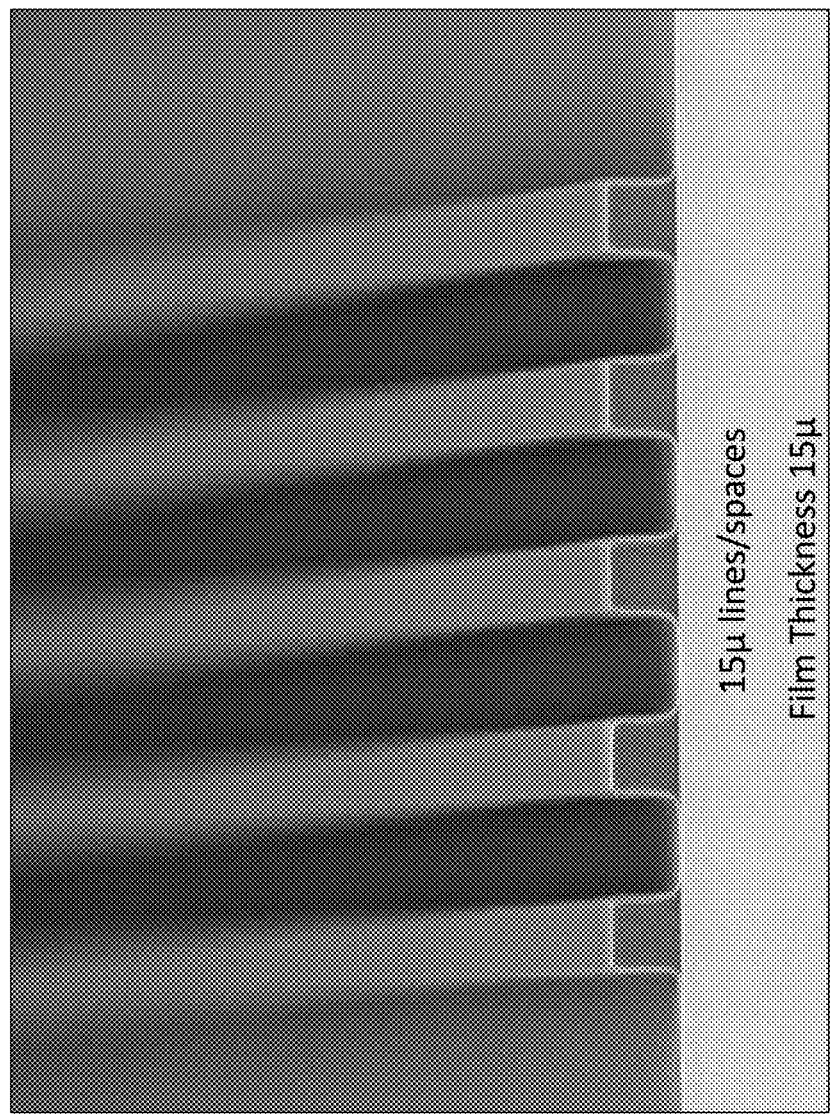
FIG. 1 shows an SEM of the photolithographic results of the composition and process of Example 1: 15μ lines and spaces in a 15μ thick film.

Disclosed and claimed herein are novel photoimageable low dielectric compositions for dielectric passivation layers, dielectric protection layers as well as dielectric redistribution layers for use in the manufacture of semiconductors, semiconductor packages and circuit board constructions. Also disclosed and claimed herein are methods of using the novel compositions including, for example, liquid coating, ink jet and dry film applications.

1. In a first embodiment, disclosed and claimed herein are photoimageable compositions, comprising at least one first polyphenylene oxide-co-polybutadiene polymer having the following general formula:

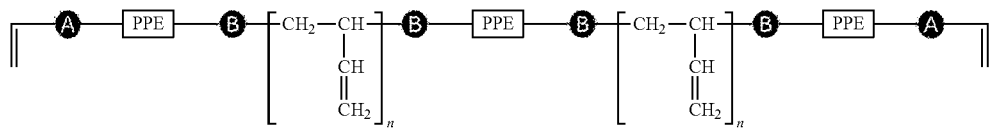

wherein PPE represents a polyphenylene oxide monomer, oligomer, polymer or a combination thereof, wherein A represents an ester section wherein the carboxy group of the ester is connected to the vinyl group or a urethane group wherein the nitrogen of the urethane group is connected to the vinyl group, wherein B represents an ester linking group or a urethane linking group, wherein n is 25-100, and wherein the polyphenylene oxide monomer, oligomer, polymer or a combination thereof may be substituted with hydrogen, branched or unbranched, substituted or unsubstituted alkyl groups of 1-16 carbon atoms with or without one or more heteroatoms substituted into the chain, substituted or unsubstituted aromatic groups, substituted or unsubstituted heteroaromatic group, substituted or unsubstituted fused aromatic or fused heteroaromatic group, substituted or unsubstituted cycloalkyl groups with or without one or more heteroatoms substituted into cyclic ring, halogens, chalcogens, pnictogens, oxides of sulfur, oxides of phosphorous, silicon, and oxides of silicon.

In a second embodiment, disclosed and claimed herein are photoimageable compositions of the above embodiment, further comprising at least one free radical crosslinking component, at least one free radical photoinitiator, and at least one solvent.

In a third embodiment, disclosed and claimed herein are photoimageable compositions of the above embodiments wherein the at least one first polyphenylene oxide-co-polybutadiene polymer of general formula 1, has a MW between about 5K and 200K.

In a fourth embodiment, disclosed and claimed herein are photoimageable compositions of the above embodiments wherein the at least one free radical crosslinking component is a monomeric, oligomeric, or polymeric compound comprising at least two acrylate, methacrylate, cinnamyl, vinyl, allyl, olefinic, succinic, or maleimide free radial reactive groups or substituents, wherein the reactive groups are substituents of the compound or are an integral part of the compound.

In a fifth embodiment, disclosed and claimed herein are photoimageable compositions of the above embodiments wherein the at least one free radical crosslinking component having the following formula:

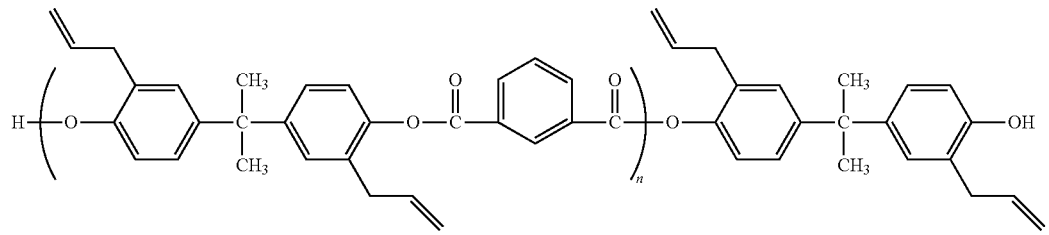

In a sixth embodiment, disclosed and claimed herein are photoimageable compositions of the above embodiments wherein the at least one free radical photoinitiator comprises an organic carbonyl compound, benzophenone, benzoin, benzoin ethers, benzoin esters, an imidazole, a diimidazole, an aminocoumarin, a quinone, an oxime, an oxime ester, a polynuclear aromatic, a halogen-containing compounds, tris-trichloromethyl triazine, and combinations thereof.

In a seventh embodiment, disclosed and claimed herein are photoimageable compositions of the above embodiments further comprising a synergistic photosensitive compound, a photoacid generator, a photobase generator, an aromatic amine, an antioxidant, a free radical inhibitor/antioxidant, an adhesion promotor or combinations thereof.

In an eighth embodiment, disclosed and claimed herein are photoimageable compositions of the above embodiments wherein the at least one solvent comprises esters, glycols, glycol ethers, glycol esters, ethyl lactates, ethers, aromatic-ethers, ether-esters, ketones, keto-esters, hydrocarbons, aromatics, heterocyclics, cycloaliphatics, cycloaliphatics containing heteroatoms, morpholino-based and halogenated solvents.

In a ninth embodiment, disclosed and claimed herein are photoimageable compositions of the above embodiments wherein the photoacid generators are onium salts, sulphonium salts, iodonium salts, diazonium salts, halogenated triazines, and sulfonated esters.

In a tenth embodiment, disclosed and claimed herein are photoimageable compositions of the above embodiments wherein the photobase generators are carboxylated xanthones, carboxylated ketoprofens, borate salts, carbamates, o-carbamoyl-hydroxyamines, carbanoyloximes, aromatic sulfonamides, alpha lactams, carboxylates and amides.

In an eleventh embodiment, disclosed and claimed herein are photoimageable compositions of the above embodiments wherein the adhesion promoter is a monomeric, oligomeric or polymeric trialkoxysilane, unsaturated trialkoxysilane, or heteroatom containing trialkoxysilane.

In a twelfth embodiment, disclosed and claimed herein are photoimageable compositions of the above embodiments wherein the synergistic photosensitive compound is an anthracene, a coumarin, an acene, a tertiary amine, arsine, phosphine or combinations thereof.

In a thirteenth embodiment, disclosed and claimed herein are photoimageable compositions wherein the free radical inhibitor/anti-oxidant is a piperide-1-oxyl, a hydrazyl or a triaryl phosphine, triaryl phosphites.

In further embodiments, disclosed and claimed herein are methods for forming dielectric layers and patterns comprising the steps of providing a substrate, applying the photoimageable composition of the above embodiments to a desired wet thickness, heating the coated substrate to remove a substantial portion of the solvent to obtain a desired thickness, imagewise exposing the coated photosensitive composition to actinic radiation, soft baking the exposed coated substrate, removing the unexposed areas of the photosensitive composition using an organic solvent developer, and final baking the remaining photoexposed composition, wherein the photosensitive composition is spin coated to a thickness of between about 1 and about 50 microns, the coated photosensitive composition is heated to between about 70° C. and about 95° C. for between about 6 minutes to about 2 minutes, the coated photosensitive composition is imagewise exposed from about 80 mJ/cm² to about 110 mJ/cm², the coated and photoexposed coated substrate is soft baked at between about 100° C. and about 120° C. for between about 90 seconds to about 150 seconds, the coated photosensitive composition are removed with esters, glycols, glycol ethers, glycol esters, ethyl lactates, ethers, aromatic-ethers, ether-esters, ketones, keto-esters, hydrocarbons, aromatics, heterocyclics, cycloaliphatics, cycloaliphatics containing heteroatoms, morpholino-based and halogenated solvents or propylene glycol monomethyl ether acetate developer, or combinations thereof, and the final baking is about 1 hour at about 200° C.

DETAILED DESCRIPTION

As used herein the conjunctive "and" is intended to be inconclusive and the conjunctive "or" is not intended to be exclusive unless otherwise indicated. For example, the phrase "or, alternatively" is intended to be exclusive.

As used herein, the term "and/or" refers to any combination of the foregoing elements including using a single element.

As used herein the terms "composition" and "formulation" are used interchangeable and mean the same thing.

As used herein the phrase "remove a substantial portion of the solvent" refers to removing, by heat, at least 92% of the solvent from the composition after it has been heated.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

As used herein the terms photoinitiator and photoactive compound are used interchangeably and are meant to mean the same.

As used herein the terms free radical inhibitor and antioxidant are used interchangeably and are meant mean the same.

As used herein the phrase remove a substantial portion of the solvent refers to removing, by heat, at least 92% of the solvent from the composition after it has been heated.

The photoimageable compositions of the current disclosure include at least one first polyphenylene oxide-co-polybutadiene polymer having a general formula (1):

wherein PPE represents a polyphenylene oxide monomer, oligomer, polymer or a combination thereof of the general formula (2):

FORMULA 2

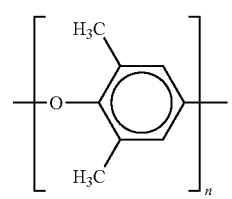

The PPE may include other component such as, for example, any of the bis-phenols, such as, for example, bis-phenol A (formula 3):

FORMULA 3

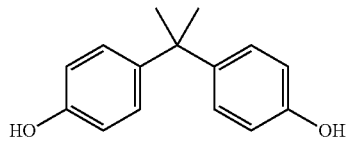

or bis-phenol F, bis-phenol B, bis-phenol C or substituted bis-phenol materials, or combinations thereof. A represents a linkage between the PPE and the unsaturated end groups and can be, but is not limited to, an ester section wherein the carboxy group of the ester is connected to the vinyl group and or a urethane group wherein the nitrogen of the urethane group is connected to the vinyl group. B represents linkage between the PPE and the polybutadiene and can be, but is not limited to, an ester linking group or a urethane linking group. n is between about 25 and about 100. Both the polyphenylene oxide monomer, oligomer, polymer or a combination thereof and the polybutadiene co-component may be substituted with hydrogen, branched or unbranched, substituted or unsubstituted alkyl groups of 1-16 carbon atoms with or without one or more heteroatoms substituted into the chain, substituted or unsubstituted aromatic groups, substituted or unsubstituted heteroaromatic group, substituted or unsubstituted fused aromatic or fused heteroaromatic group, substituted or unsubstituted cycloalkyl groups with or without one or more heteroatoms substituted into cyclic ring, halogens, chalcogens, pnictogens, oxides of sulfur, oxides of phosphorous, silicon, and oxides of silicon. The polyphenylene oxide-co-polybutadiene polymer has a MW between about 5K and 200K.

Compositions of the current disclosure include at least one free radical crosslinking component. The crosslinking component contain at least 2 free radical reactive groups which may be pendent on the component or an integral part of the component, that is, situated in the backbone of the component. The component may be a monomer, an oligomer, or a polymer. Free radical reactive groups suitable

FORMULA 1

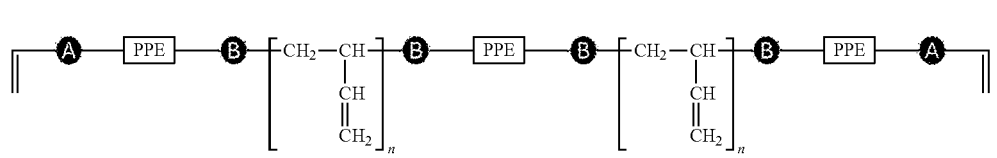

for the current disclosure are well known in the industry and include compounds containing unsaturated moieties such as, for example acrylates, methacrylates, cinnamyl compounds, vinyl compounds, vinyl ethers, allyl compounds, olefinic compounds, succinic compounds, or maleimide compounds free or combinations thereof. Examples of a free radical crosslinking components suitable for the current disclosure is represented by formula (4-6):

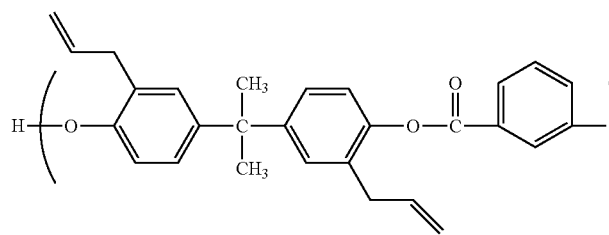

FORMULA 4

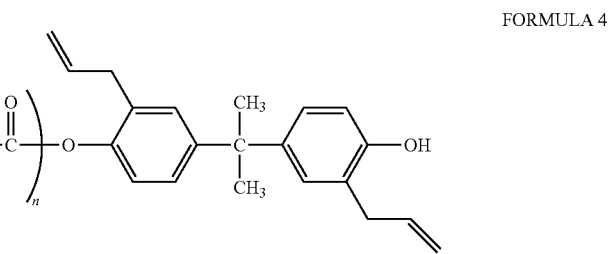

FORMULA 5

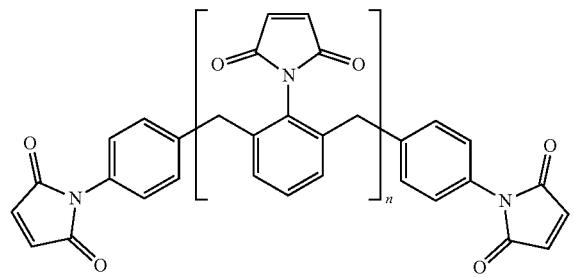

FORMULA 6

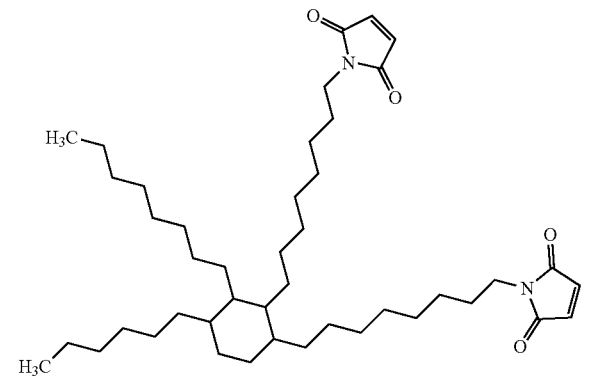

The compositions of the current disclosure include free radical photoinitiators. Examples of photoinitiators useful for the current disclosure are well known in the literature and include, for example, the Irgacure® photoinitiators from Ciba, such as for example the oxime ester, Irgacure® OXE-02 (Formula 7):

FORMULA 7

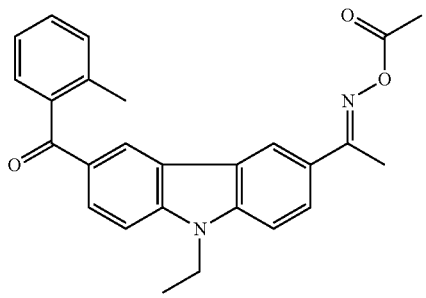

as well as the benzoins, 3,3'-carbonyl bis(7-diethylamninocoumarin, ketocoumarins, alkyl esters of p-dialkylbenzoic acid, camphorquinones, 2,4,5-triphenylimidazilyl dimer, azo compounds, sulfur containing compounds, oximes, oxime esters, amines, polynuclear compounds, organic carbonyl compounds and mixtures thereof as described in U.S. Pat. No. 4,343,885, anthraquinones, phenanthiroquinones, naphithoquinones, vicinyl ketaldonyl alcohols such s benzoin, pivaloin, acyloin ethers, benzoin mono- and di-ethers, benzoin mono- and di-esters, alpha-hydrocarbon-substituted aromatic acyloins, including alpha-methylbenzoin, alpha-allylbenzoin, and alpha-phenylbenzoin. Photoreducible dyes and reducing agents disclosed in U.S. Pat. Nos. 2,850,445; 2,875,047; and 3,097,096 as well as dyes of the phenazine, oxazine, and quinone classes; benzophenone, 2,4,5-tripheniylimidazolyl dimers with hydrogen donors, and mixtures thereof as described in U.S. Pat. Nos. 3,427,161; 3,479,185; and 3,549,367 can be also used as photoinitiators. Other suitable photoactive compounds for the current disclosure include, for example, 3-phenyl-5-isoxazolone/benzanthrone; 2-t-butylanthraquinone; 2,2-dimethoxy-2-phenylacetophenone; I-hydroxycyclohexylphenyl ketone, diethoxyacetophenone. 2,4,6,-tris-(trichloromethyl)-1,3,5-triazine with 3,3'-carbonyI bis(7-diethylaminocoumarin), 1-methyl-2-benzylmethylene-1,2-dihydronaphthiol (1,2-d) thiazole, or 9-phenylacridine; 2-mecaptobenzimidazole with 9-phenylacridine; and 3-phenyl-5-isoxazoline with 9-fluorenone or 1-methyl-2-benzylmethylene-1,2-dihydronaphtho(1,2-d) thiazole. Other suitable photoactive components are ketones having morpholino and S-phenyl groups, 2-methyl-1-[4 (methylthio)phenyl]-2-morpholinopropan-1-one. Also useful with photoinitiators are sensitizers as disclosed in U.S. Pat. No. 4,162,162. One or more of the photoinitiators may be used in the current disclosure.

The compositions of the current disclosure may also include one or a combination of synergistic photosensitive materials which may act as photosensitizers, photoinitiator aids, catalysts and the like, which can absorb actinic radiation and interact with the photoinitiator to provide improved photoreactions resulting in increased photospeed as well as broadening the spectra of wavelengths useful to initiate the crosslinking. Photoactive materials which may act as photosensitizers and/or photo-synergists include photoacid generators and photobase generators. Photosensitizers useful for the current disclosure include, for example, anthracene-based materials, 1,8-dimethoxy-9,10-bis(phenylethynyl)anthracene (DMBA), 6,13-bis(3,4,5-trimethoxyphenylethynyl)pentacene (BTMP), 5,12-bis(phenylethynyl)tetracene (BPET), 1-Chloro-4-propoxythioxanthone (CPTX), 4-methylphenyl[4-(1-methylethyl) phenyl]tetrakis(pentafluorophenyl) borate (FABA-PAG), 1,5,7 triaza-bicyclo [4.4.0] dec-5-ene tetraphenylborate (TBD-PBG), or any combination thereof. Other synergistic photosensitizer materials include, for example, coumarins, acenes, tertiary amines, arsines, phosphines or combinations thereof. Though, not a free radical generator, triphenylphosphine may be included in the photoactive chemical system as a catalyst. Such free-radical generators are suitable for use with negative-acting photoimageable compositions.

The photoacid generators useful in the present invention are any compounds which liberate acid upon exposure to light, typically at a wavelength of about 320 to 420 nanometers, however other wavelengths may be suitable. Photoacid generators suitable for the current disclosure, include, for example, halogenated materials such as triazines, onium salts, and sulfonated esters. Useful halogenated triazines include halomethyl-s-triazines, 2-[l-(3,4-benzodioxolyl)]-4,6-bis(trichloromethyl)-1,2,5-triazine, 2-[1-(2,3-benzodioxolyl)]-4,6-bis(trichloromethyl)-1,3,5-triazine, 2-[1-(3,4-benzodioxolyl)]-4,6-bis(tribromomethyl)-1,3,5-triazien and the like. Onium salts with weakly nucleophilic anions are suitable for use as photoacid generators in the current disclosure. Examples of such anions are the halogen complex anions of divalent to heptavalent metals or non-metals, for example, antimony, tin, iron, bismuth, aluminum, gallium, indium, titanium, zirconium, scandium, chromium, hafnium, copper, boron, phosphorus and arsenic. Examples of suitable onium salts include, but are not limited to: diaryl-diazonium salts and onium salts of group VA and B, IIA and B and I of the Periodic Table, for example, halonium salts, quaternary ammonium, phosphonium and arsonium salts, aromatic sulfonium salts and sulfoxonium salts or selenium salts. Examples of suitable onium are disclosed in U.S. Pat. Nos. 4,442,197; 4,603,101; and 4,624,912. The sulfonated esters useful as photoacid generators in the current disclosure include, for example, sulfonyloxy ketones, benzoin tosylate, t-butylphenyl alpha-(p-toluenesulfonyloxy)-acetate, and t-butyl alpha-(p-toluenesulfonyloxy)-acetate. Such sulfonated esters are disclosed in the *Journal of Photopolymer Science and Technology*, vol. 4, No. 3, 337-340 (1991).

Photobase generators useful for the current disclosure include, for example, carboxylated xanthones, for example 1,5,7-triazabicyclo[4.4.0]dec-5-ene 2-(9-oxoxanthen-2-yl) propionate and 1,8-diazabicyclo[5.4.0]undec-7-ene 2-(9-oxoxanthen-2-yl) propionate; carboxylated ketoprofens, for example 1,2-diisopropyl-3-[bis(dimethylamino) methylene]quanidium 2-(3-benzoyphenyl) propionate and 1,8-diazabicyclo[5.4.0]undec-7-ene 2-(3-benzoylphenyl) propionate, borate salts such as 1,2-dicyclohexyl-4,4,5,5-tetramethyldiquadium n-butyl triphenylborate, and carbamates such as (2-nitrophenyl)methyl 4-(methacryloyloxy) piperidine-1-carboxylate and 2-nitrobenzyl cyclohexyl carbamate. Additional photobase generators useful for the current disclosure are the non-ionic materials provided by WAKO® Chemical under the tradename WPBG®. Other examples of suitable photobase generators include photoactive carbamates such as benzyl carbamates and benzoin carbamates, O-carbamoylhydroxylamines, O-carbamoyloximes, aromatic sulfonamides, alpha-lactams, and amides such N-(2-arylethyenyl) amides. Other examples of photo-base generators are disclosed in U.S. Pat. Nos. 5,627,010, 7,300,747, 8,329,771, 8,957,212, and 9,217,050, which are incorporated by reference herein for their teachings of photo-base generators.

The composition of the current disclosure may include a free radical inhibitor/anti-oxident such as an antioxidant, which can stabilize the composition to prevent premature free radical reactions of the free radical sensitive groups, such as carbon-carbon unsaturationed moieties. It is also believed that the free radical inhibitor that is generated upon photoexposure terminates the radicals that grow into unexposed regions of the resist. In this way, the growth of radicals into the unexposed areas is controlled such that polymerization is confined to the exposed areas. As a result, a mask pattern may accurately be reproduced in the resulting photoresist image. Suitable stable free radical inhibitors are those that react rapidly with carbon free radicals. Examples of such inhibitors are 2,2,6,6-tetramethylpiperidine-1-oxyl, 2,2-diphenyl-1-picrylhydrazyl, derivatives of these compounds, and combinations thereof. Such derivatives of 2,2,6,6-tetramethylpiperidine-1-oxyl include, for example: 4-hydroxy-2,2,6,6-tetramethylpiperidinyl-1-oxyl; 4-amino-2,2,6,6-tetramethylpiperidinyl-1-oxyl; 4-acetamido-2,2,6,6-tetramethylpiperidine-1-oxyl; 2,2,6,6-tetramethyl-4-oxo-piperidinyl-1-oxy; 4-methoxy-2,2,6,6-tetramethylpiperidinyl-1-oxy; 4-hydroxy-2,2,6,6-tetramethylpiperidine-1-oxyl benzoate; 4-cyano-2,2,6,6-tetramethylpiperidinyl-1-oxy; and 4-carboxy-2,2,6,6-tetramethyl-piperidyl-1-oxy, and the like. The inhibitor is present in the composition in the amount of between about 0.04 and about 0.3 wt % based on the total weight of the composition. Other free radical inhibitors of the hydroquinone and phenol families may also be advantageously included in the composition.

Other components of the currently disclosure include adhesion promoters such as, for example, monomeric, oligomeric, or polymeric trialkoxysilane, unsaturated trialkoxysilane or heteroatom trialkoxysilane. Other adhesion promoters well known in the art may also be used.

The compositions of the current disclosure include at least one solvent. Solvents useful for the current disclosure both as solvent for the composition and developer include, for example, esters, ethers, ether-esters, ketones, keto-esters, hydrocarbons, aromatics, and halogenated solvents, as well as solvents having one or more polar functional groups such as hydroxyl, ether, amide, ester, ketone, and carbonate, for example, two functional groups, which may be the same or different, such as two hydroxyl groups or one hydroxyl group and one ether group. Selected from the group consisting of polyol, glycol ether, glycol esters, aromatics, morpholino-based solvents, diacetone alcohol, 2-pyrrolidinone, N-methylpyrrolidinone, ethyl lactate, propylene carbonate, 1,3-dimethyl-2-imidazolidindione, and alkyl esters, and any combination thereof.

Polyols, for example, include polyethylene glycol, polypropylene glycol, poly(ethylene-co-propylene glycol), polyvinyl alcohol, trimethylol propane, ethylene glycol, glycerin, diethylene glycol, triethylene glycol, tripropylene glycol, tetraethylene glycol, pentaethylene glycol, 1,2-propylene glycol, 1,3-propanediol, butylene glycol, triethylene glycol, 1,2,6-hexanetriol, thiodiglycol, hexylene glycol, bis-2-hydroxyethyl ether, 1,4-butanediol, 1,2-butenediol, 1,4-butenediol, 1,3-butenediol, 1,5-pentanediol, 2,4-pentanediol, 2,4-heptanediol, 1,8-octanediol, 1,10-decanediol, 1,12-dodecanediol, 1,4-cyclohexanediol, 1,4-cyclohexanedimethanol, 1,2-bis(hydroxymethyl)cyclohexane, 1,2-bis(hydroxyethyl)-cyclohexane, 3-methyl-1,5-pentanediol, 2,2,4-trimethyl-1,3-pentanediol, neopentyl glycol, pentaerythritol, sorbitol, mannitol, and any combination thereof, and preferably the polyol is selected from the group consisting of polyethylene glycol, trimethylol propane, ethylene glycol, glycerin, diethylene glycol, tripropylene glycol, and any combination thereof, Glycol ethers include, for example, ethylene glycol monomethyl ether, ethylene glycol monoethyl ether, propylene glycol monomethyl ether, tripropylene glycol monomethyl ether, ethylene glycol monobutyl ether, diethylene glycol monomethyl ether, diethylene glycol monoethyl ether, propylene glycol n-propyl ether, propylene glycol t-butyl ether, propylene glycol n-butyl ether, dipropylene glycol methyl ether, dipropylene glycol n-propyl ether, dipropylene glycol, t-butyl ether, dipropylene glycol n-butyl ether, tripropylene glycol n-propyl ether, tripropylene glycol t-butyl ether, tripropylene glycol n-butyl ether, ethyl cellosolve, methyl cellosolve, polyethylene glycol monomethyl ether, polypropylene glycol monomethyl ether, methoxytriglycol, ethoxytriglycol, butoxytriglycol, 1-butoxyethoxy-2-propanol, and any combination thereof, and preferably, the glycol ether is selected from the group consisting of ethylene glycol monomethyl ether, ethylene glycol monoethyl ether, propylene glycol monomethyl ether, tripropylene glycol monomethyl ether, ethylene glycol monobutyl ether, diethylene glycol monomethyl ether, diethylene glycol monoethyl ether, and any combination thereof.

Triphenylphosphine and triphenylphosphite may be included in the photoactive chemical system as a catalyst. Such free-radical generators are suitable for use with negative-acting photoimageable compositions. Mixtures of photoactive components may optionally be used. When two photoactive components are used, they may be used in any ratio, such as from 99:1 to 1:99. The photoactive components are present in an amount of from about 0.05 to about 10 wt % based on the total weight of the composition The compositions further may include one or more stable free radical inhibitor. Without wishing to be bound by any-particular theory, it is believed that the free radical inhibitor terminates the radicals that grow into unexposed regions of the resist. In this way, the growth of radicals into the unexposed areas is controlled such that polymerization is confined to the exposed areas. As a result, the mask pattern may accurately be reproduced in the resulting photoresist image. The stable free radical inhibitors are anaerobic, meaning that they do not require the presence of oxygen for efficient polymerization inhibition. Typical ranges of the components (% wt/wt) of the photoimageable composition include polyphenylene oxide-co-polybutadiene polymer 15%-85%, crosslinker: 5%-22%, flexibilizer, when present: 0%-20.0%, free radical initiator 0.8%-15.0%, adhesion promoter, cure synergist 0.5-1.5%
when present: 0.8%-1.5%, free radical inhibitor when present 0.04-0.5% and surfactant, when present: 0.04%-0.13%. The amount of solvent used in the present compositions is that amount necessary to provide compositions having a total solids content of 45 wt % or greater. Other particularly useful compositions are those having a total solids content of between about 10 wt % and about 40%.

In other embodiments disclosed and claimed herein are processes using the currently disclosed photoimageable compositions. Providing a substrate, such as, for example, a silicon wafer, as is, or the wafer may be treated with a number of coatings including adhesion promotors, metal layers, oxide layers and the like. The wafer may also contain prefabricated structures such as other dielectric layers, or metal layers such as for example, copper, aluminum, gold, and the like. The current compositions are then applied to the surface of the substrate and coated using such techniques as spin coating, curtain coating, brush coating, dip coating and the like. The coating may be applied by ink-jet techniques in which case the full surface of the substrate may be coated or only portions of the surface may be coating as desired. In this technique structures as small as about 4-10 nm may be applied to the surface of the substrate. Coating thicknesses may be between. 1-15 microns. Solvent is removed to less than about 92% by heating, such as, for example 80-95° C. for 2-4 minutes. Once the substrate has been coated, the photoimageable composition is exposed with actinic radiation in a desired pattern. The radiation may be I-line (365 nm), G-line, H-line (or broadband combination, UV, EU V, E-beam, visible or other actinic radiation well known in the art used for photolithography, for example 75 to 100 mJ/cm2. The coating may then optionally be heated to between 100-120° C. for 1-2 minutes to improve the curing of the exposed areas. The unexposed areas are then removed using a suitable developer such as propylene glycol monomethyl ether acetate, aqueous or organic solvent, as described above. The developer may be at room temperature or heated. The resulting structure may optionally be heated in a single stage to increase the cure, for example, 150-250° C. for 45-130 minutes.

EXAMPLES

Example 1

To 100 g of polyphenylene oxide-co-polybutadiene (Formula 1) MW 30K, was added 6.32 g of BMI 689 from Designer Molecules (Formula 6), 0.44 g γ-methacryloxypropyl-trimethoxysilane, 1.45 g Irgacure® OXE-02 from BASF® (oxime ester) and XXXX g N-formylmorpholine. The composition was spin coated onto a silicon wafer to 15 microns. The coated wafer was soft baked at 80° C. for 4 minutes. The wafer was exposed to 100 m/cm$_2$ of i-line (365 nm) radiation. The wafer was post exposure baked at 110° C. for 2 minutes. The unexposed areas were removed using room temperature PGMEA. The resulting structures were then cured at 200° C. for 1 hr to give the pattern shown in FIG. 1.

Example 2

Figure 2:
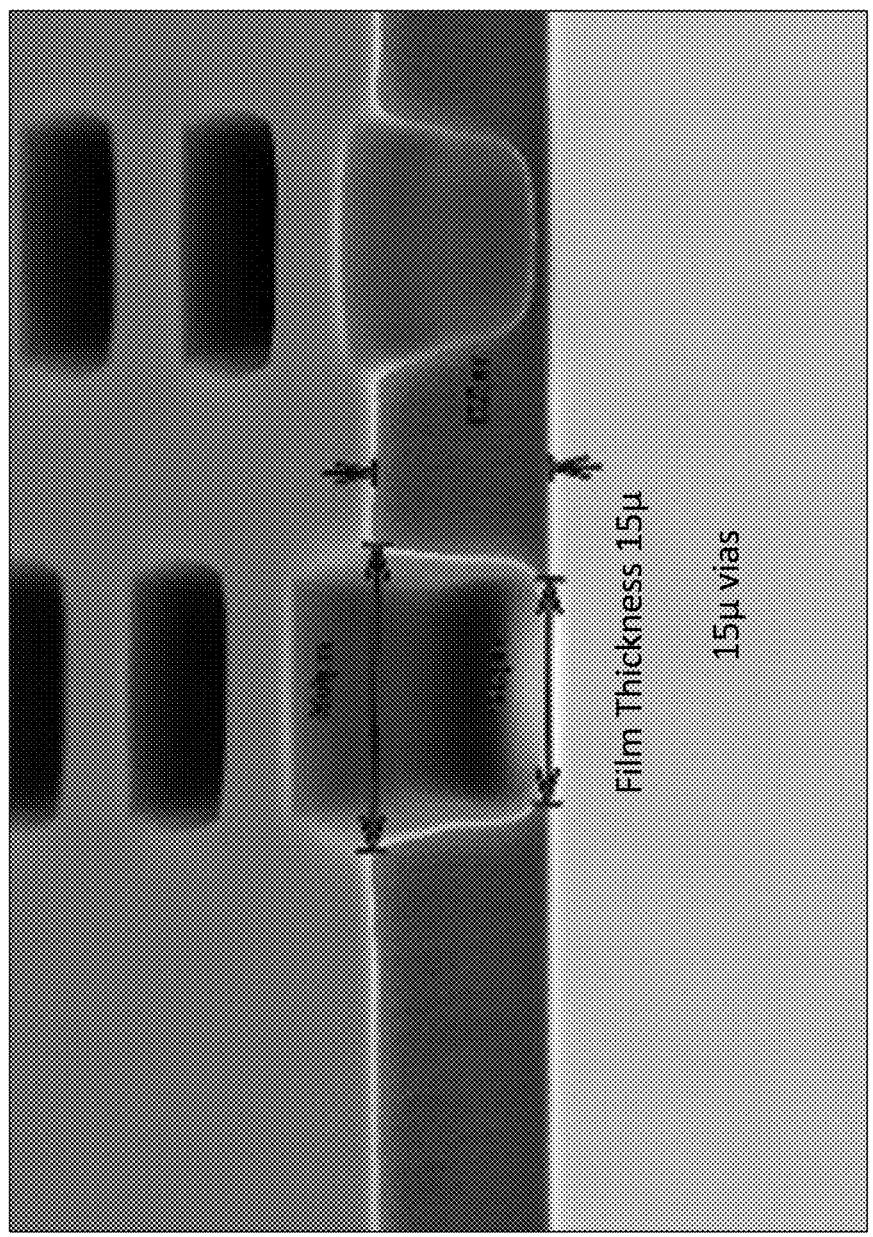
FIG. 2 shows an SEM of the photolithographic results of the composition and process of Example 1: 15μ vias in a 15μ thick film.

Example 1 was repeated with a spin-on coating of 10 microns. The soft bake was altered to 95° C. for 2 minutes. The process resulted in patterns shown in FIG. 2.

Example 3

Figure 3:
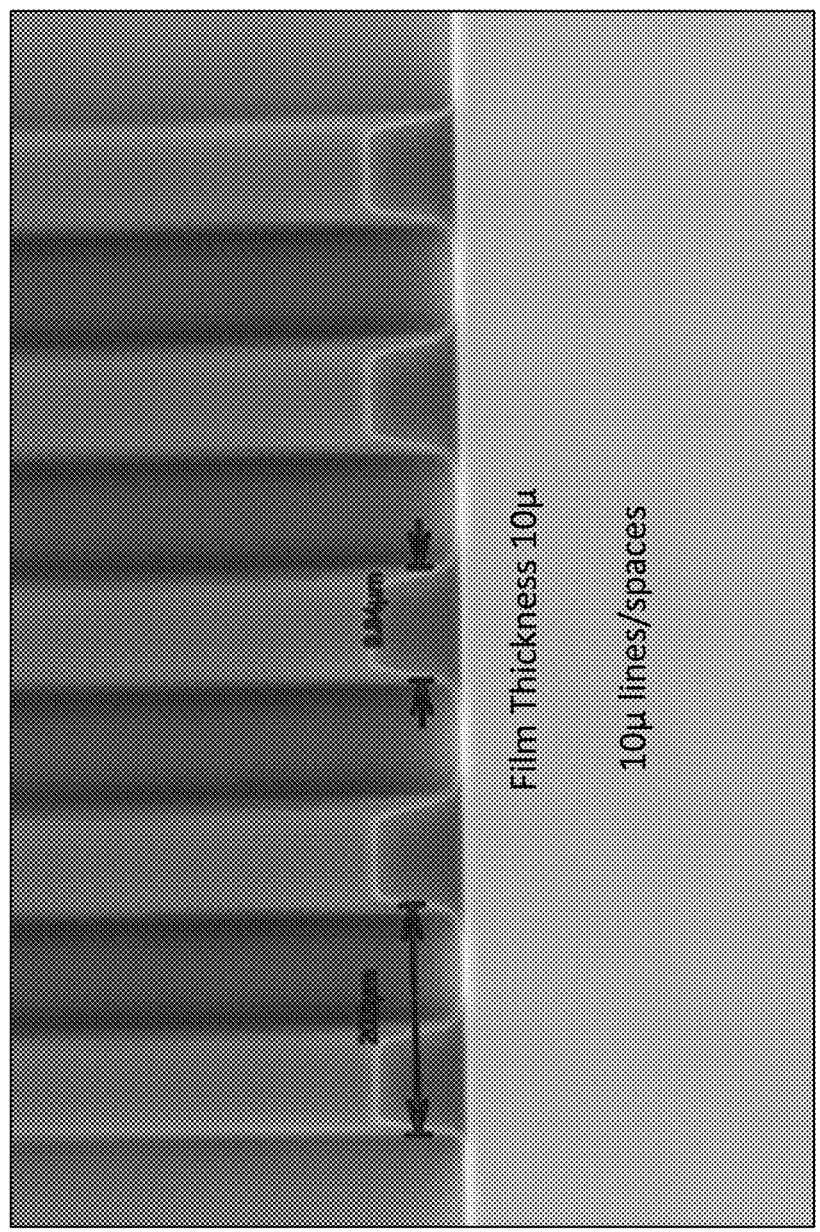
FIG. 3 shows an SEM of the photolithographic results of the composition and process of Example 2: 10μ lines and spaces in a 10μ thick film.
Figure 4:
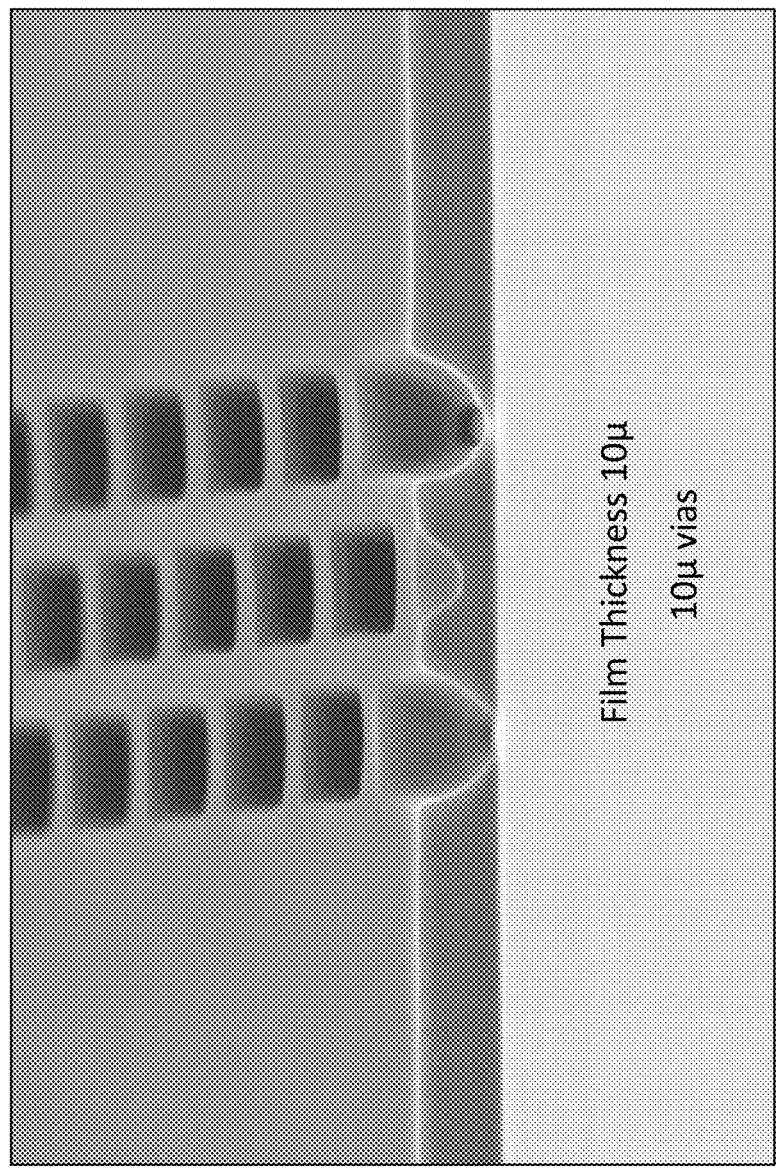
FIG. 4 shows an SEM of the photolithographic results of the composition and process of Example 2: 10μ vias in a 1μ thick film.
Figure 5:
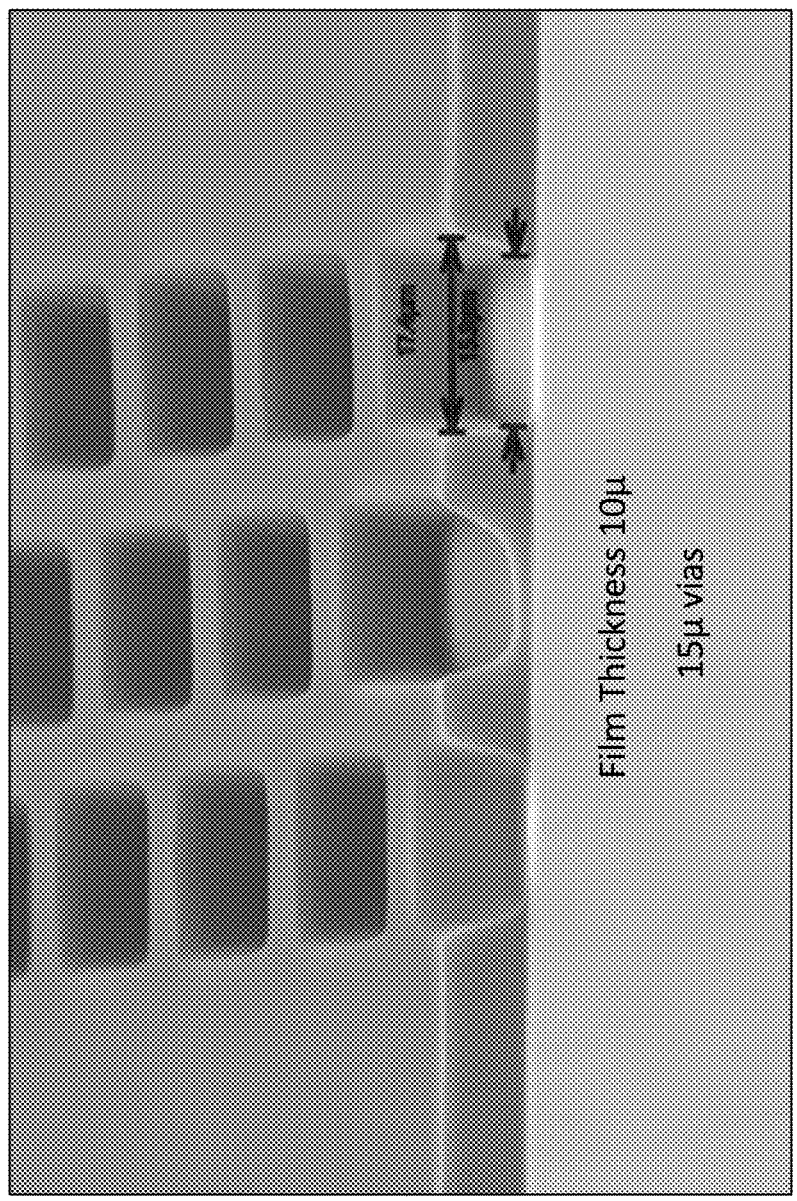
FIG. 5 shows an SEM of the photolithographic results of the composition and process of Example 2: 15μ vias in a 10μ thick film.
Figure 6:
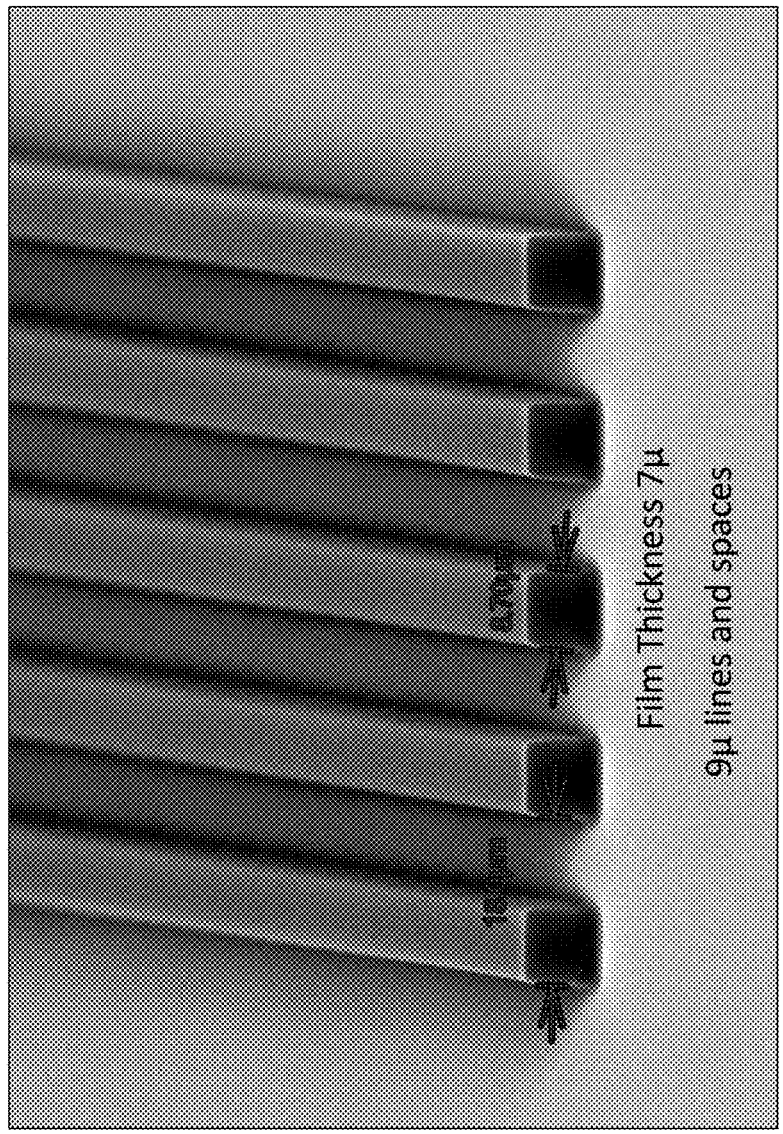
FIG. 6 shows an SEM of the photolithographic results of the composition and process of Example 3: 9μ lines and spaces in a 7μ thick film.
Figure 7:
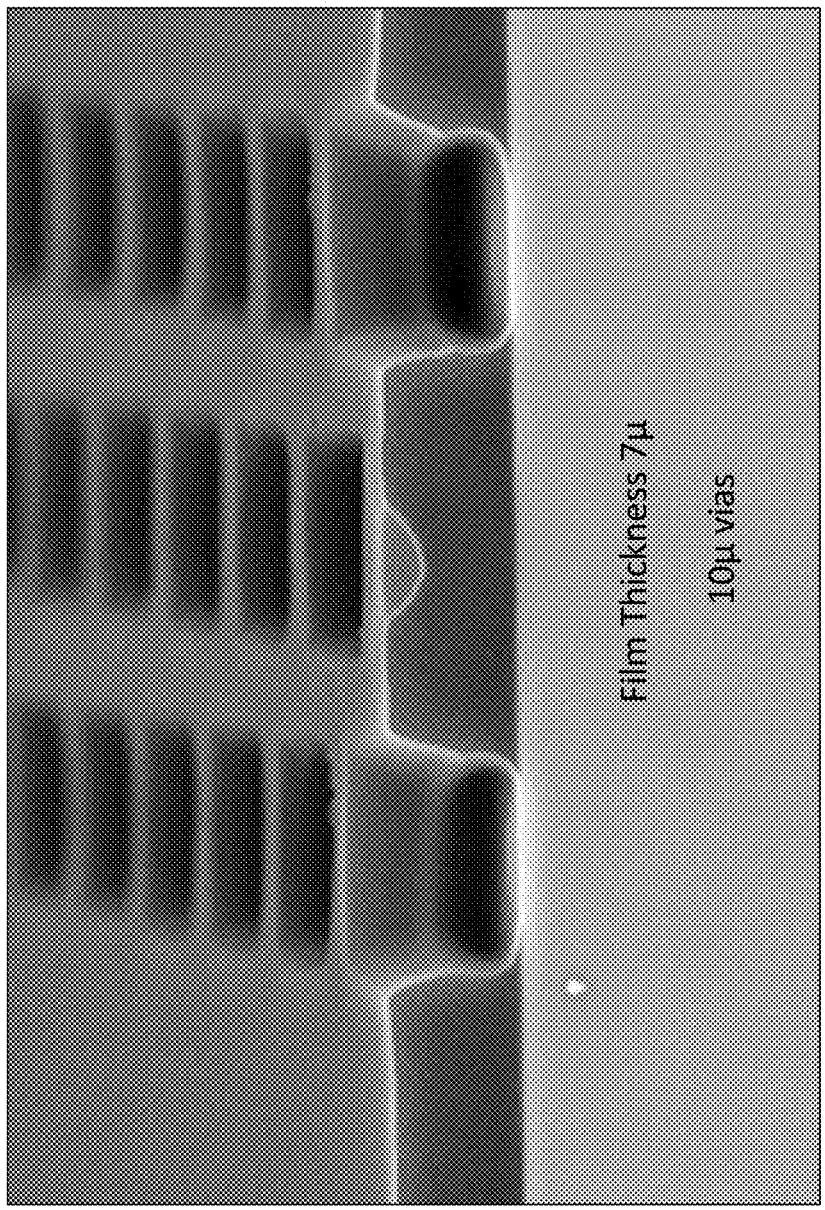
FIG. 7 shows an SEM of the photolithographic results of the composition and process of Example 3: 10μ vias in a 7μ thick film.
Figure 8:
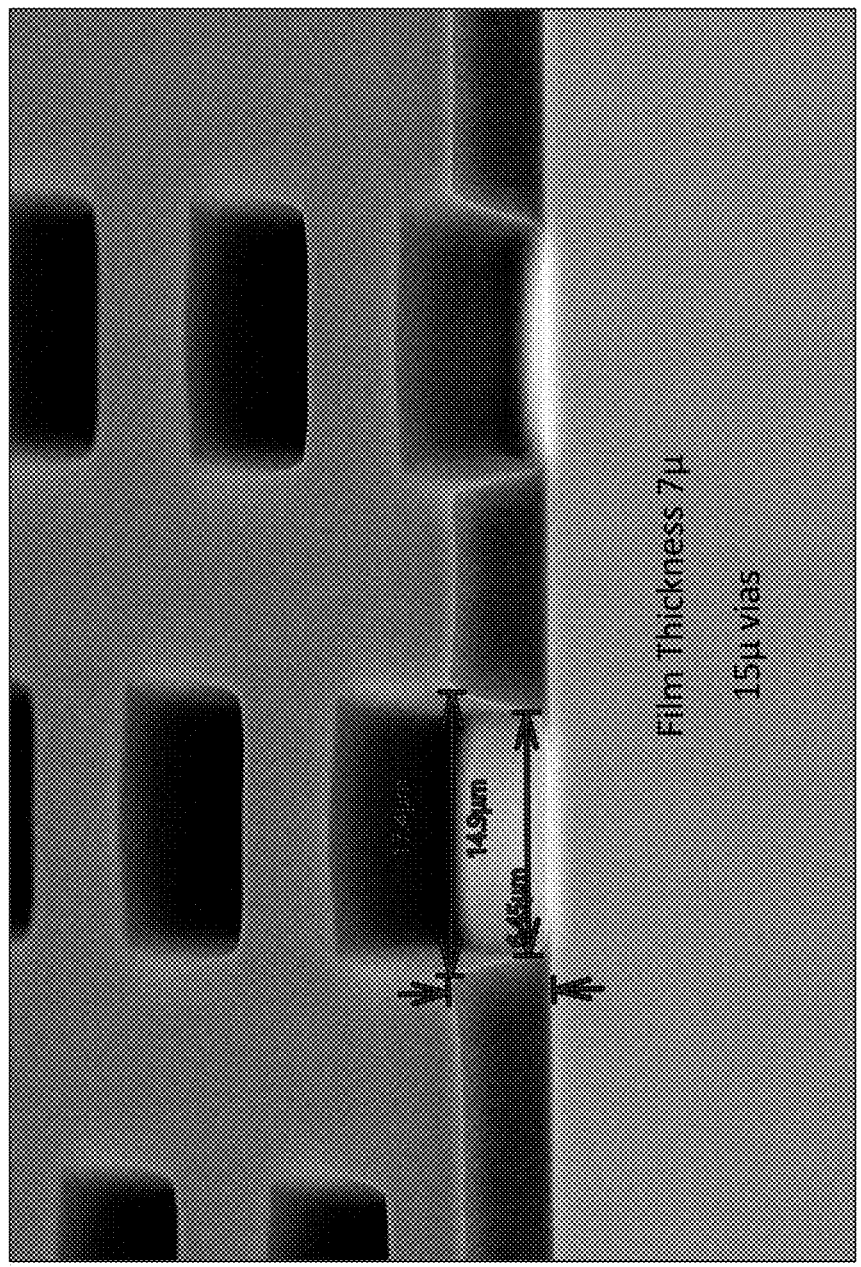
FIG. 8 shows an SEM of the photolithographic results of the composition and process of Example 3: 15μ vias in a 7μ thick film.

Example 1 was repeated with a spin-on coating of 7 microns. The soft bake was altered to 95° C. for 2 minutes. The process resulted in patterns shown in FIG. 3.

The processed compositions of the current disclosure provide excellent Chemical, Thermal, Mechanical and Processing properties. The processed structures from Example 1 show the following properties:

Moisture Absorption 0.03% vs 0.14% for BCB (benzocyclobutane) withstands exposure to water better. Dielectric constant: 2.5 vs 2.65 for BCB, better dielectric properties, 5% Thermal Wt Loss (N2): 413° C. vs 482° C. for polyimide, withstands high temperature exposure. Youngs modulus: 1.6 vs 2.9 for BCB, improved flexibility.

The processed composition withstands, with no film loss, NMP 1 hr 80 C; DMSO 1 hr 90 C; Acetone 1 hr 25 C; 10% H2SO4 15 min 25 C; BOE (6:1 NH4F:HF) 1 hr 25 C.

We claim:
1. A photoimageable composition, comprising:
At least one first polyphenylene oxide-co-polybutadiene polymer having a general formula (1):

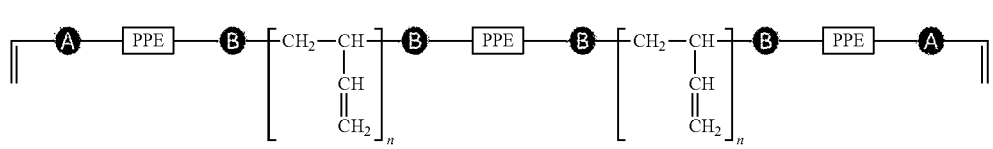

FORMULA 1 wherein PPE represents a polyphenylene oxide monomer, oligomer, polymer or a combination thereof, wherein A represents an ester section wherein the carboxy group of the ester section is connected to a vinyl group or a urethane group, wherein the nitrogen of the urethane group is connected to the vinyl group, wherein B represents an ester linking group or a urethane linking group, wherein n is 25-100, and wherein the polyphenylene oxide monomer, oligomer, polymer, or a combination thereof may be substituted with hydrogen, branched or unbranched, substituted or unsubstituted alkyl groups of 1-16 carbon atoms with or without one or more heteroatoms substituted into the chain, substituted or unsubstituted aromatic groups, substituted or unsubstituted heteroaromatic groups, substituted or unsubstituted fused aromatic or fused heteroaromatic groups, substituted or unsubstituted cycloalkyl groups with or without one or more heteroatoms substituted into the cyclic ring, halogens, chalcogens, pnictogens, oxides of sulfur, oxides of phosphorous, silicon, and oxides of silicon.

2. The photoimageable composition of claim 1, further comprising
   a. At least one free radical crosslinking component,
   b. At least one free radical photoinitiator, and
   c. At least one solvent.

3. The photoimageable composition of claim 1, wherein the at least one first polyphenylene oxide-co-polybutadiene polymer of general formula 1, has a MW between about 5K and 200K.

4. The photoimageable composition of claim 2, wherein the at least one free radical crosslinking component is a monomeric, oligomeric, or polymeric compound comprising at least two acrylate, methacrylate, cinnamyl, vinyl, vinyl ethers, allyl, olefinic, succinic, or maleimide free radical reactive groups or substituents.

5. The photoimageable composition of claim 4, wherein the at least one free radical crosslinking component has the formula (2):

6. The photoimageable composition of claim 2, wherein the at least one free radical photoinitiator comprises an organic carbonyl compound, a benzophenone, a benzoin, a benzoin ethers, a benzoin esters, an imidazole, a diimidazole, an aminocoumarin, a quinone, an oxime, an oxime ester, a tris-trichloromethyl triazine, or combinations thereof.

7. The photoimageable compositions of claim 2, further comprising a synergistic photosensitive compound, a photoacid generator, a photobase generator, an aromatic amine, an antioxidant, an adhesion promotor, or combinations thereof.

8. The photoimageable composition of claim 2, wherein the at least one solvent comprises esters, glycols, glycol ethers, glycol esters, ethyl lactates, ethers, aromatic-ethers, ether-esters, ketones, keto-esters, hydrocarbons, aromatics, heterocyclics, cycloaliphatics, cycloaliphatics containing heteroatoms, morpholino-based solvents or halogenated solvents.

9. The photoimageable compositions of claim 7, wherein the photoacid generators is at least one of an onium salt, a sulphonium salt, an iodonium salt, a diazonium salt, or a halogenated triazine or a sulfonated esters.

10. The photoimageable compositions of claim 7, wherein the photobase generators is at least one of is a carboxylated xanthones, a carboxylated ketoprofen, an o-carbamoyl-hydroxyamine, a carbamoyloxime, an aromatic sulfonamide, an alpha lactam, a carboxylate or an amide.

11. The photoimageable composition of claim 7, wherein the adhesion promoter is a monomeric, oligomeric, or polymeric trialkoxysilane, an unsaturated trialkoxysilane, or a heteroatom containing trialkoxysilane.

12. The photoimageable composition of claim 7, wherein the synergistic photosensitive compound is an anthracene, a coumarin, an acene, a tertiary amine, an arsine, a phosphine or combinations thereof.

13. The photoimageable composition of claim 7, wherein the antioxidant is a piperide-1-oxyl, a hydrazyl, a triaryl phosphine, or a triaryl phosphite.

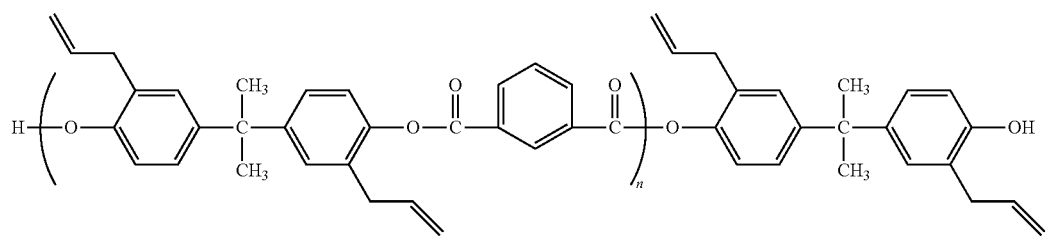

FORMULA 2

14. A method for forming dielectric layers and patterns comprising the steps of:
  i. providing a substrate,
  ii. applying the photoimageable composition of claim 2 to a desired wet thickness,
  iii. heating the substrate to remove a substantial portion of the solvent to obtain a desired thickness,
  iv. imagewise exposing the coated photoimageable composition to actinic radiation,
  v. soft baking the exposed coated substrate
  vi. removing the unexposed areas of the photoimageable composition using an organic solvent developer, and
  vii. baking the remaining photoexposed, photoimageable composition.

15. The method of claim 14, wherein the photoimageable composition is spin coated to a thickness of between about 1 and about 50 microns.

16. The method of claim 15, wherein the coated photoimageable composition is heated to between about 70° C. and about 95° C. for between about 6 minutes to about 2 minutes.

17. The method of claim 16, wherein the coated photoimageable composition is imagewise exposed from about 80 mJ/cm$^2$ to about 150 mJ/cm$^2$.

18. The method of claim 17, wherein the photoimageable composition coated and photoexposed substrate is soft baked at between about 100° C. and about 120° C. for between about 90 seconds to about 150 seconds.

19. The method of claim 18, wherein the unexposed areas of the photoimageable composition are removed with esters, glycols, glycol ethers, glycol esters, ethyl lactates, ethers, aromatic-ethers, ether-esters, ketones, keto-esters, hydrocarbons, aromatics, heterocyclics, cycloaliphatics, cycloaliphatics containing heteroatoms, morpholino-based and halogenated solvents or propylene glycol monomethyl ether acetate developer, or combinations thereof.

20. The method of claim 19, wherein the final baking is about 1 hour at about 200° C.

\* \* \* \* \*